United States Patent [19]

Gosser et al.

[11] 4,181,885

[45] Jan. 1, 1980

[54] ELECTRICAL CELL CHARGE ENERGY MEASURING METHOD AND APPARATUS

[75] Inventors: Robert B. Gosser, Hempfield Township., Westmoreland County; John M. Zomp, North Huntingdon, both of Pa.

[73] Assignee: Westinghouse Electric Corp., Pittsburgh, Pa.

[21] Appl. No.: 904,684

[22] Filed: May 10, 1978

[51] Int. Cl.² .......................................... G01N 27/42
[52] U.S. Cl. ..................................... 324/428; 320/48
[58] Field of Search ................... 324/29.5; 320/14, 23, 320/43, 44, 48

[56] References Cited

U.S. PATENT DOCUMENTS

| | | | |
|---|---|---|---|
| 3,271,652 | 9/1966 | Walz et al. | 320/44 |
| 3,484,681 | 12/1969 | Grady, Jr. | 324/29.5 |
| 3,500,167 | 3/1970 | Applegate et al. | 320/14 |
| 3,621,359 | 11/1971 | Schnegg | 320/43 |
| 3,656,061 | 4/1972 | Mallory | 324/29.5 |
| 3,676,770 | 7/1972 | Sheraf | 324/29.5 |
| 3,805,157 | 4/1974 | Acks et al. | 324/29.5 |
| 3,857,087 | 12/1974 | Jones | 324/29.5 |
| 3,895,284 | 7/1975 | Schweizer | 320/48 |
| 3,944,904 | 3/1976 | Hase | 320/23 |
| 3,971,980 | 7/1976 | Jungfer | 324/29.5 |
| 3,993,985 | 11/1976 | Chopard | 340/249 |
| 3,997,888 | 12/1976 | Kremer | 340/249 |
| 4,012,681 | 3/1977 | Finger | 320/14 |
| 4,052,717 | 10/1977 | Arnold | 324/29.5 |
| 4,080,560 | 3/1978 | Abert | 324/29.5 |

Primary Examiner—M. Tokar
Attorney, Agent, or Firm—D. F. Straitiff

[57] ABSTRACT

Method and apparatus for measuring the charge energy available from electrochemical cells (batteries) of the type that exhibits a substantially constant discharge voltage characteristic over its charge life, such as zinc-silver oxide cells. Within several seconds following a brief period of shorting out for reactivation, two to four seconds in the case of zinc-silver oxide cells, short circuit current from the test cell flowing for a period of time just sufficient for complete charging of the internal capacitance of such test cell is sensed, integrated over such period, and used to control display of information as to the charge level of the cell under test.

10 Claims, 7 Drawing Figures

ELECTRICAL CELL CHARGE ENERGY MEASURING METHOD AND APPARATUS

BACKGROUND OF THE INVENTION

1. Field of the Invention

Electrochemical cell charge testing.

2. Description of the Prior Art

In order to determine the charge status of an electrochemical cell or battery of the primary type, such as zinc-silver oxide cells intended for electronic watch service, for example, it has been the practice to measure the drop in terminal voltage of such cell under load for a specified period of time. In many cases it has been found that cells so tested have failed to perform adequately in terms of useful energy life.

SUMMARY OF THE INVENTION

Investigations by the present inventors led to the discovery that factory-fresh cells of 100% charge capacity often display a dormant or apparent loss that results in failure to pass the terminal voltage drop under load test. It was also discovered that zinc-silver oxide cells that have been intentionally depleted of 100% of their rated capacity will recover sufficiently after a rest period to pass the usual terminal voltage drop under load test and that cells with 50% or less remaining charge capacity develop a high internal resistance that dominates the usual terminal voltage drop under load test and renders it impossible thereby to distinguish 50% remaining capacity from cells having less than 10% remaining capacity.

As a result of such discoveries on the part of the present inventors the method and apparatus of the present invention was devised to provide valid information as to the extent of charge available from zinc-silver oxide cells, and to obtain such information in a convenient, rapid, straightforward manner. In accord with this method and apparatus each zinc-silver oxide cell undergoing test for charge capacity is first shorted out for a period of several seconds, that is its terminals are connected across a zero impedance current path to assure activation of any cell that might otherwise be dormant. The cell is then allowed to rest for a period of several seconds, four seconds, for example. Finally, the cell is again connected across a short circuit current path of substantially zero impedance for a short period of time such as one-half second, for example, and the short circuit current is sensed and integrated during such period to provide information representative of the level of charge remaining in the battery undergoing the test. This information is then represented on a meter calibrated in terms of percent of charge remaining in the battery. The zero impedance short circuit current path for the electrochemical cell undergoing test is provided by a current-to-voltage converter that includes an operational amplifier, a feedback resistor, and related transistor circuitry for matching the operating current output of the cell under test with the operating parameters of the operational amplifier. A gated integrator that includes another operational amplifier and storing capacitor translates the voltage output from the current-to-voltage converter back to the form of a current storable by the capacitor to represent the flow of current from the cell under test during the selected period of time. The charge on the storage capacitor representing the current flow from the cell under test during the selected time interval is introduced to a meter circuit that includes a meter calibrated in terms of percent of capacity remaining in the battery at time of test. To control the effectuation of short circuiting of the cell under test for activation and the subsequent measuring of short circuit current over the selected interval of time for storage energy level measurement, etc., the present invention includes by way of exemplification solid state circuitry for effectuating and timing the several events involved. Provision is made within the apparatus of the present invention to accommodate cells of different energy storage capacity.

Other features and advantages of the invention will become apparent from the following more detailed description of the invention.

DETAIL DESCRIPTION OF THE INVENTION

Figure 3:
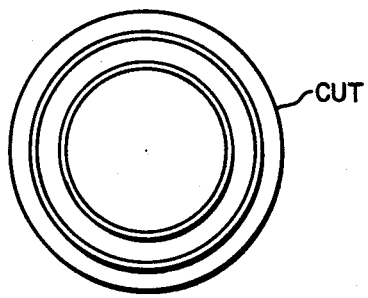
FIGS. 2 and 3 are elevation and plan views, respectively, in outline showing a typical zinc-silver oxide electrochemical cell, sometimes referred to as battery, of the type used for operation of electronic watches.
Figure 4:
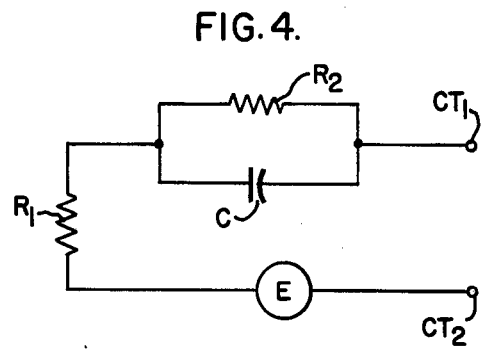
FIG. 4 is an equivalent discharge circuit diagram depicting the typical internal electrical characteristics of an electrochemical cell.
Figure 2:
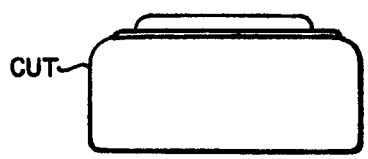
Figure 5:
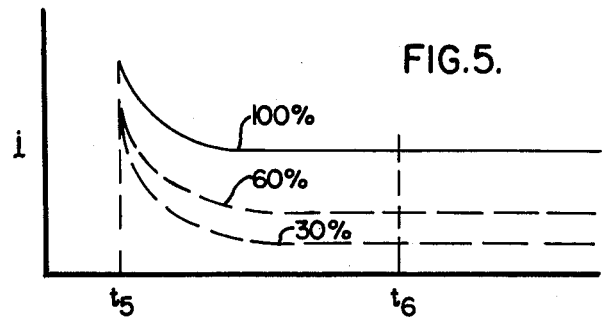
FIG. 5 is a curve showing the short circuit current flow characteristics of a suitably activated zinc-silver oxide cell over a period of time.

Electrochemical cells, such as the zinc-silver oxide type depicted in FIGS. 2 and 3, can be represented by the equivalent discharge circuit shown in FIG. 4 where the cell terminals are indicated as CT1 and CT2. As the cell capacity (i.e., the electrical energy stored in the cell) is depleted, the internal resistances R1 and R2 increase while the internal capacitance C decreases. In accord with the present invention, recognition of the change in internal resistance and capacitance values in the cell under test is utilized to represent the extent of charge remaining in such cell. This information is derived by measuring the effect of such change in internal electrical characteristics of the battery on flow of current from the cell under conditions where the internal electrical characteristics have a significant influence on such current; such as during flow of such current by way of a short circuit path of substantially zero impedance. To assure that the current flow under one cell charge condition can be correlated with current flow from a cell under a different storage charge condition, the short circuit current measurement in each instance is made over the same time period relative to initiation of current flow. During the initial period of current flow, a period of about one-half second, for example, the current changes rapidly under influence of the internal capacitance of the cell, primarily, and then tends to become relatively stable for a following prolonged period of time. Whereas it can be feasible to measure the current flow at a selected time or period following such initial prestabilization period to obtain meaningful information with respect of the state of charge of the cell, the preferred mode of operation of the present invention measures the total current flowing during such initial period and utilizes this information to represent the charge condition of the cell undergoing test. This has the advantage of simplifying the timing of the current reading period, and what may be more important, enables the amount of time required for obtaining such current flow information to be kept to a minimum. Where the testing of capacity or state of charge of electrical cells is in a production line where such cells may be installed in devices utilizing same, the advantage of minimizing cell test time can be appreciated. In FIG. 5 the curves marked 100%, 60% and 30% represent the flow of short circuit current from three zinc-silver oxide cells of the same size, number 393, for example, under charge conditions corresponding to the same percentage relative to full charge. The time period between T5 and T6 is one-half second, with the time T5 representing the point of initiation of short circuit current flow and measurement of such flow.

A working embodiment of the present invention has been constructed and tested. This working embodiment was constructed of electrical components either in stock at time of construction or readily available and is shown in circuit diagram form in FIG. 1 and in outline view of the housing in FIG. 7. In the circuit diagram of FIG. 1 it is believed that all the information necessary to build a similar working device is indicated. The value of the voltages, the resistances, and the capacitances is shown, together with identifying handbook numbers for the transistor and integrated circuit components, as well as the pin or terminal numbers of such integrated circuit components.

Figure 1:
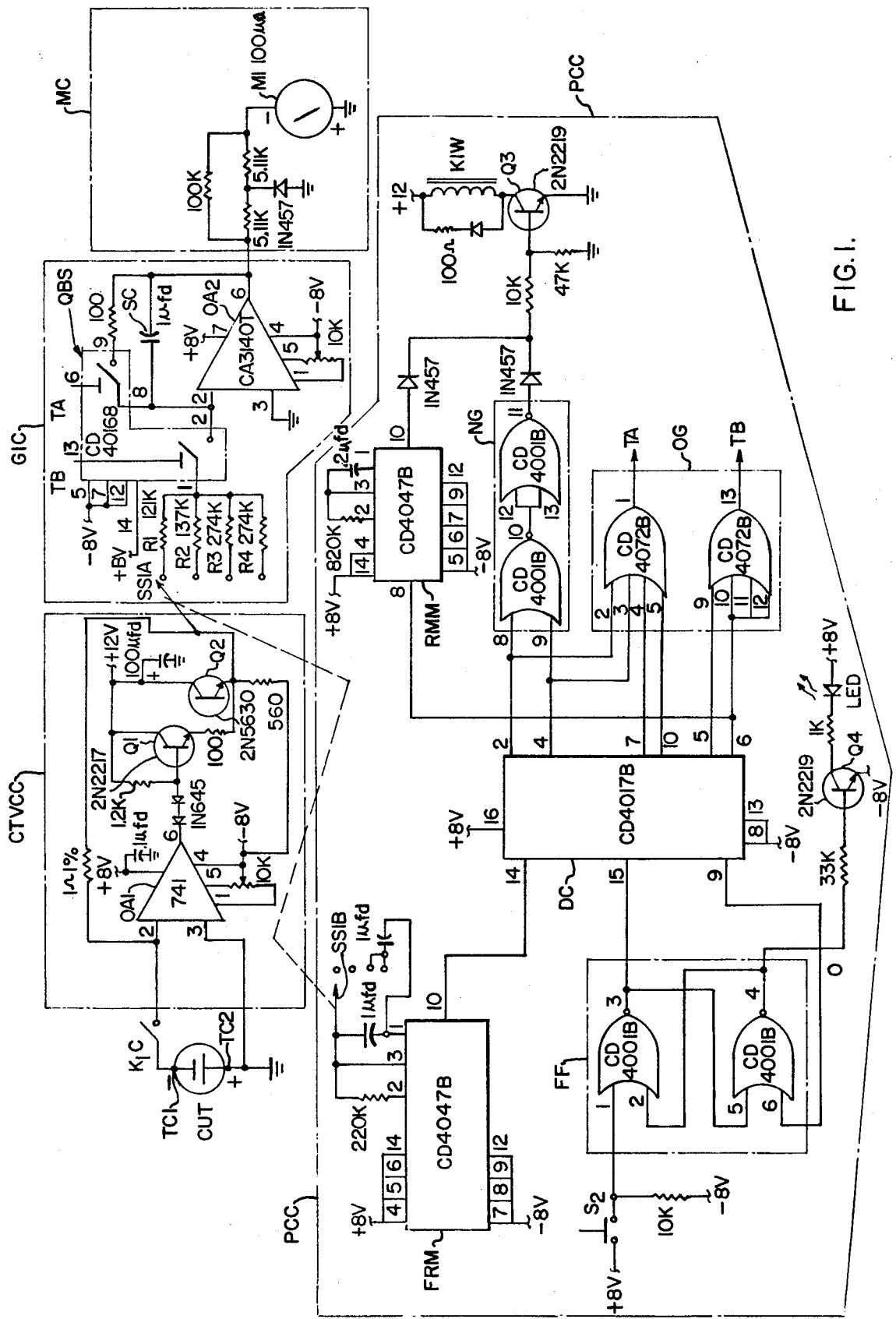
FIG. 1 is a circuit diagram of an operating embodiment of the invention as constructed to demonstrate operability of the invention by the inventors with use of components on hand that are readily available. The apparatus of FIG. 1 represents the best mode presently contemplated for carrying out the invention, although conceivably under variable ambient temperature conditions it may be desirable to introduce a temperature compensating means into the circuit in the usual well-known manner.
Figure 7:
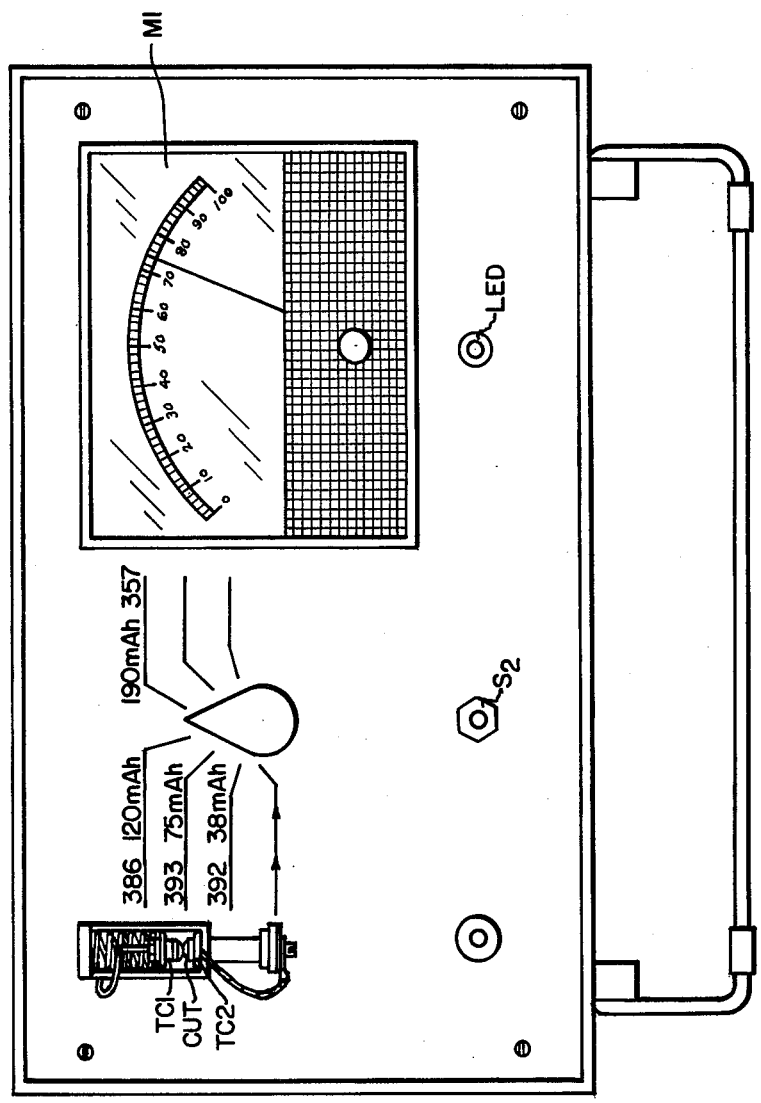
FIG. 7 is a front elevation view of the developmental cell testing device embodying the circuit FIG. 1.

Referring to the circuit diagram of FIG. 1, the cell under test CUT will be introduced to the test circuit by way of a pair of spring biased separable contacts TC1 and TC2 located in the front of the test instrument as shown in FIG. 7 for ready accessibility. Once the cell undergoing test is inserted between the contacts CT1 and CT2 the test is initiated by actuation of a pushbutton switch S2 of a program control circuit PCC to be described subsequently. Such initial closure of the relay contact K1 establishes a substantially zero impedance short circuit current path between the terminals of the cell under test CUT by way of a current-to-voltage converter circuit CTVCC that basically includes the operational amplifier AO1, the one ohm feedback resistor, and transistors Q1 and Q2 affiliated with such operational amplifier to handle the level of current involved. Such initial short circuiting of the cell undergoing test CUT is for purposes of activating such cell which may be in what is referred to as a dormant state that typically occurs to such as zinc-silver oxide cells that have been inactive for a period of time. For certain zinc-silver oxide cells such as number 392 and number 393, such period of short circuit activation will be chosen to be two seconds, while for some of the larger size zinc-silver oxide cells such as number 386 and number 357 such short circuit activation period of four seconds has been found to be more suitable. Opening of the relay contact K1 is effectuated to terminate such activation by disestablishing the short circuit current paths for the cell under test CUT. The relay contact K1 remains open for a period such as several seconds to permit the open terminal voltage of the cell under test to become reestablished. Following such rest period the relay contact K1 is again closed for a period of one-half second. During this short interval of relay contact K1 closure short circuit current will again flow from the battery under test CUT by way of the current to voltage converter circuit CTVCC which will function to cause a voltage to appear at the selector switch contact SS1A proportional to the level of short circuit current flowing from the cell undergoing test CUT. During such half-second interval of short circuit current flow from the cell undergoing test CUT by way of the momentarily closed relay contact K1 the corresponding voltage appearing at selector switch contact SS1A causes a corresponding current to flow to a storage capacitor SC by way of a solid state switch $T_B$ by virtue of action of an operational amplifier $OA_2$ in a gated integrator circuit GIC. Gated integrator circuit GIC also includes selectable resistors R1, R2, R3, and R4 affiliated with the switch contact SS1A and connected in series with the solid state switch $T_B$ to regulated the current according to the size of the cell undergoing test. The storage capacitor SC becomes charged to a voltage corresponding to the total amount of short circuit current flowing from the cell undergoing test CUT during such half-second interval of relay K1 switch closure and retains such charge which in turn is read by the meter $M_1$ of a meter circuit MC. This voltage stored in the storage capacitor SC as appearing on the meter $M_1$, being representative of the short circuit current flowing from the cell under undergoing test CUT for a carefully regulated half-second period following a period of previous activation of the cell, has been found through a series of tests to represent an accurate indication of the amount of energy storage remaining in the cell and the meter has been calibrated accordingly in terms of percent of charge capacity remaining in the cell CUT. In the exemplified instrument of FIGS. 1 and 7, the test reading will be maintained by the meter $M_1$ until after the storage capacitor SC in the gated integrator circuit GIC has been shorted out by closure of the solid state switch $T_A$ at subsequent time of operation of the device.

Upon introduction of a new electrochemical cell or battery of the zinc-silver oxide type between the the test terminals TC1 and TC2, such cell then becomes the new cell under test CUT and the process control circuit PCC is operated in the following manner.

Figure 6:
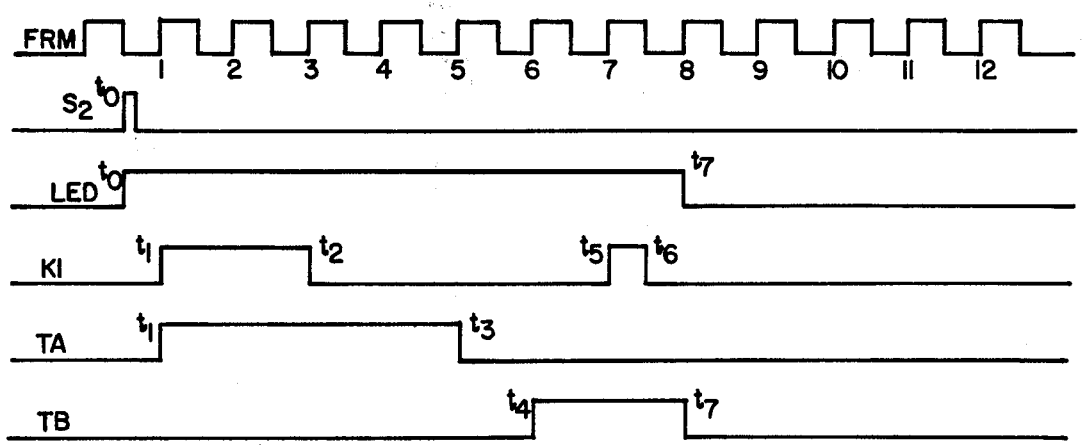
FIG. 6 is a schematic timing diagram depicting operating times of the essential components in the circuit of FIG. 1.

Referring to FIGS. 1, 6 and 7, the pushbotton switch S2 is depressed momentarily by actuation at the front of the housing of the test device. This causes a pulse to appear at terminal 1 of a flip-flop FF which responds to release the reset at terminal 15 of a decade counter DC which responds to accept a sequence of clock pulses appearing at its terminal 14 from a free running multivibrator FRM that delivers such pulses to the terminal 14 of decade counter DC at a rate of one positive pulse per second or one positive pulse per two seconds according to the size of the battery under test and as determined by position of selector switch contact SS1B; the faster pulse rate chosen for testing of the smaller size batteries such as numbers 392 and 393, for example, and the slower pulse rate as chosen for testing of the larger size batteries such as numbers 357 and 386, for example. As such decade counter DC thus is effectuated to start to count down, the first two positive pulses appearing at its output terminals 2 and 4 connected to terminals 8 and 9 of an OR gate OG to cause such gate to effect flow of energizing current by way of the transistor Q3, for the duration of such two positive pulses, to the K1 relay winding K1W to effect closure of the K1 relay contact K1C for effecting the initial flow of short-circuit activating current for the cell under test CUT as previously described between the periods $T_1$ and $T_2$ which in the case of the smaller batteries will be a period of two seconds and for the larger batteries will be a period of four seconds. It will be appreciated that whereas the free running multivibrator FRM or clock pulse generator will be delivering square wave clock pulses as shown in FIG. 6, it is the positive fronts of such clock pulses at desired intervals that the decade counter DC responds to as appearing at its terminal 14 to deliver corresponding pulses at its output terminals. Such two pulses appearing at terminals 8 and 9 of the NOR gate NG to cause energization of the relay winding K1W for a corresponding period also simultaneously appear at terminals 2 and 3 of an OR gate OG to cause closure of the solid state switch $T_A$ for discharging the storage capacitor SC and permitting the meter to return to zero at the beginning of initiation of the new test period that commences with the activation of the cell under test CUT. Immediately upon termination of the first two pulses from the decade counter DC the NOR gate NG will respond to disrupt its supply of current to the relay coil winding K1W, to permit the relay K1 to open and terminate the flow of short circuit activation current from the cell under test CUT.

At the same time that the first two pulses from the decade counter DC appear at the input terminals 8 and 9 of the NOR gate NG such pulses also appear at terminals 2 and 3 of OR gate OG to close the solid state switch $T_A$ affiliated with the gated integrator G1 for shorting out the storage capacitor SC and permitting the meter $M_1$ to return to zero coincidental with initiation of the new test cycle.

$T_A$ is allowed to remain closed for the following third and fourth pulse cycles from the decade counter which appear at terminals 4 and 5 of the OR gate OG. Immediately upon termination of the fourth pulse from the decade counter the OR gate OG will terminate closure of the solid state switch $T_A$ and permit same to establish an open position. In the exemplified embodiment of FIG. 1 the fifth pulse from the decade counter is not used. The sixth pulse from such counter appears at terminal 9 of the OR gate OG to cause same to establish closure of the solid state switch $T_B$ and thereby establish connection of the selector switch contact SS1A to the storage capacitor SC for purposes as previously described. The OR gate is also conditioned by the next succeeding pulse, the seventh pulse from the decade counter DC, to maintain such solid state switch $T_B$ closed. Thus, such switch remains closed for the duration of two succeeding pulses from the decade counter DC, as shown on FIG. 6. At the same time that such solid state switch $T_B$ is closed, the seventh pulse appearing at the terminal 10 of the OR gate OG also appears at the trigger terminal 8 of a retriggerable monostable multivibrator RMM that responds to deliver a one-half second pulse to the relay Q3 for energization of the relay winding K1W to close its contacts K1C for a corresponding one-half second period of time during which, as previously described, the short circuit current flowing from the cell under test CUT causes charging of the storage capacitor SC of the gated integrator circuit GIC as read by the meter $M_1$ in terms of percent of remaining charge capacity of such cell under test CUT. Following such half second of energization of the relay winding K1W, its contact K1C is immediately opened to terminate the brief period of short circuit current measuring flow.

Finally, the eighth pulse appearing at terminal 9 of the decade counter DC appears at terminal 6 of the flip-flop FF to cause it to hold terminal 15 of the decade counter DC in a reset condition and effect termination of energization of a light emitting diode LED previously energized by way of transistor Q4 by the initial operation of the flip-flop FF that established the reset of the decade counter DC. This latter control of the LED indicator light source occurs via terminal 4 of the flip-flop FF.

It will be apparent to those versed in the art that the program control circuit PCC set forth in the circuit diagram in FIG. 1 might be modified considerably as to choice of components while preserving the essential function of the test program.

At the same time it would also seem to be feasible to establish a zero impedance short circuiting current path for the cell undergoing test CUT while establishing a voltage proportional to the short circuit current flow by means of a hall effect generator, for example, in substitution for the current-to-voltage converter CTVC exemplified in FIG. 1. Other modifications may also become apparent to those versed in the art without departing from the spirit and scope of the present invention as set forth in the following claims.

We claim:

1. Method for non-destructive testing of the charge energy availability of an electrochemical cell of the substantially constant-voltage-during-discharge type, comprising:
    establishing a substantially-zero-impedance information-generating short-circuit current path across the terminals of the cell under test,
    deriving information respecting integrated current flow through said short-circuit current path during a precise period of time, and
    utilizing such information to represent the extent of charge energy available from such cell.

2. The method of claim 1 further comprising an initial step of establishing an activation-inducing short-circuit current path across the cell terminals for assuring a state of cell activation prior to the deriving and utilizing of the integrated current flow information.

3. The method of claim 1, wherein said precise period of time is less than one second in duration.

4. The method of claim 1, wherein the substantially-zero-impedance information-generating short-circuit current path is established for the same period of time as that for which the integrated current flow information is derived.

5. The method of claim 2, wherein said activation-inducing short-circuit current path is of several seconds in duration and terminates several seconds prior to establishing said information-generating short-circuit current path.

6. Apparatus for non-destructive testing of the charge energy availability of an electrochemical cell of the substantially-constant-voltage-during-discharge type, comprising:
    zero-impedance means for short-circuiting said cell,
    contact means for connecting a cell to said zero-impedance means, information deriving means responsive to integrated current flow from said cell through said zero-impedance means, cell-energy-availability display means responsive to information from said deriving means, and program means controlling the period of effectiveness of said zero-impedance means and of said information deriving means.

7. The apparatus of claim 6, wherein said program means renders said zero-impedance means and said information deriving means:

effective and ineffective, respectively, during a cell activation period, both ineffective during a rest period, and both effective during an energy availability testing period.

8. The apparatus of claim 7, wherein the cell activation and rest periods are made to be less than five seconds long and said energy availability testing period is less than one second long.

9. The apparatus of claim 6, wherein said program means is adjustable to change the activation and rest periods to suit different cell energy sizes.

10. The apparatus of claim 6, wherein said program means renders the zero-impedance means and information deriving means effective for one-half second for an energy availability test period.